Aug. 23, 1966 D. J. CARLSON ETAL 3,268,827

INSULATED-GATE FIELD-EFFECT TRANSISTOR AMPLIFIER HAVING MEANS TO REDUCE HIGH FREQUENCY INSTABILITY

Filed April 1, 1963 2 Sheets-Sheet 1

INVENTORS
DAVID J. CARLSON
& GERALD E. THERIAULT
By Eugene M. Whitacre
Attorney

INVENTORS
DAVID J. CARLSON &
GERALD E. THERIAULT
BY Eugene M. Whitacre
ATTORNEY

United States Patent Office 3,268,827
Patented August 23, 1966

3,268,827
INSULATED-GATE FIELD-EFFECT TRANSISTOR AMPLIFIER HAVING MEANS TO REDUCE HIGH FREQUENCY INSTABILITY

David J. Carlson, Princeton, and Gerald E. Theriault, Hopewell, N.J., assignors to Radio Corporation of America, a corporation of Delaware Filed Apr. 1, 1963, Ser. No. 269,525
12 Claims. (Cl. 330—18)

This invention relates in general to electrical circuits employing semiconductor devices and more particularly to signal translating circuits which include insulated-gate field-effect transistors.

Insulated-gate field-effect transistors, as the name implies, are field effect transistors having a gate electrode which is insulated from the source and drain electrodes. These transistors have attractive characteristics which appear to be promising for many circuit applications. Some of these characteristics are (1) high input impedance, (2) low cross modulation, (3) bilateral conduction, (4) low noise, (5) simplified direct coupling capability, and (6) compatibility with integrated circuit techniques.

It has been found that signal translating circuits using insulated-gate field-effect transistors have exhibited stability problems when operated at high frequencies. Ordinarily high frequency signal translating circuits using transistors or vacuum tubes may be stabilized by using the so-called common-base or grounded grid connections to reduce feedback between the input and output circuits. However, operation of the insulated-gate field-effect transistor in the common-gate mode does not correct the stability problem, and the circuit has been operated at low gain to maintain stability.

In addition to the foregoing problem, it has been found that distortion occurs at some signal levels particularly when the device is used in the so-called "cascode" amplifier.

Accordingly, it is an object of this invention to provide an improved high frequency signal translating circuit employing an insulated-gate field-effect semiconductor device.

It is another object of this invention to provide an improved high-frequency stable amplifier operable at high gain, employing an insulated-gate field-effect transistor.

It is still another object of this invention to provide a high-frequency amplifier circuit employing an insulated-gate field-effect transistor which provides relatively high gain operation without signal distortion.

An electrical circuit embodying the invention includes an insulated-gate field-effect semiconductor device. Such a device has source and drain electrodes formed on a substrate of semiconductor material and the gate electrode insulated from the substrate. The source and drain electrodes are in rectifying contact with the substrate. Circuit means are provided for connecting the device as the active element of a signal translating circuit such that signal voltage variations appear at the source electrode. To prevent rectification of this signal energy in the source-to-substrate rectifying junction, the substrate electrode is maintained at a potential which reverse biases the source-to-substrate rectifying junction.

When the transistor is connected in the common gate configuration, the substrate is maintained at reference potential for signal frequencies for stability purposes. The interelectrode capacitance between the drain and substrate, and between the source and substrate, is thus ineffective to provide substantial feedback which otherwise would affect the stability of the stage. The enhanced stability of the circuit of the invention enables a greater gain for a given transistor device.

In accordance with a specific embodiment of the invention the source-to-drain current paths of first and second insulated-gate field-effect transistors are connected in series. The first insulated-gate field-effect transistor is connected as a gate-input common-source amplifier, and the second transistor is connected as a source-input common-gate amplifier. To stabilize the operating characteristics of the composite stage, and to prevent distortion which may be caused by signal rectification between the source and substrate of the second transistor, the substrate of the second transistor is maintained at reference potential for direct currents.

In accordance with a feature of the invention the separate transistors of the cascode amplifier may be fabricated as an integral unit on semiconductor material to provide a simplified and inexpensive circuit. The composite device may take any of a number of configurations as will be described hereinafter, and the common substrate is connected to a point of reference potential to provide the advantages of circuit stability and the prevention of signal clipping by the substrate-to-drain or source rectifying junctions.

Accordingly, it is a further object of this invention to provide a cascode amplifier circuit, employing insulated-gate field-effect transistors as the active elements of the input and output stages of the amplifier, having high-frequency stable operation with the field-effect transistor's maximum gain and having no signal distortion.

It is still a further object of this invention to provide a high-frequency stable cascode amplifier circuit employing an integrated field-effect semiconductor device as the sole active element of the amplifier circuit.

The novel features which are considered characteristic of the invention are set forth with particularity in the appended claims. The invention itself, however, both as to its organization and method of operation as well as additional objects and advantages thereof will best be understood from the accompanying drawing in which:

Figure 1:
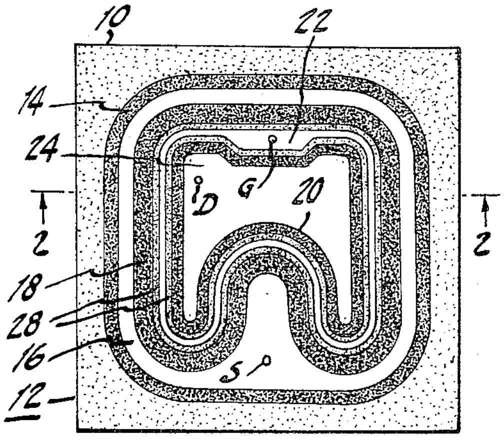
FIGURE 1 is a diagrammatic view of an insulated-gate field-effect transistor suitable for use in circuits embodying the invention.

Referring now to the drawings and particularly to FIGURE 1, a field-effect transistor 10 which may be used with circuits embodying the invention includes a substrate or a body 12 of semiconductor material. The body 12 may be either a single crystal or polycrystalline and may be of any of the semiconductor materials used to prepare transistors in the semiconductor art. Fore example, the body 12 may be nearly intrinsic silicon, such as, for example, lightly doped P-type silicon of 100 ohm-cm. material.

In the manufacture of the device shown in FIGURE 1 heavily doped silicon dioxide is deposited over the surface of the silicon body 12. The silicon dioxide is doped with N-type impurities. By means of a photo-resist and acid etching, or other suitable technique, the silicon dioxide is removed where the gate electrode is to be formed, and around the outer edges of the silicon wafer as viewed on FIGURE 1. The deposited silicon dioxide is left over those areas where the source-drain regions are to be formed.

Figures 2, 3:
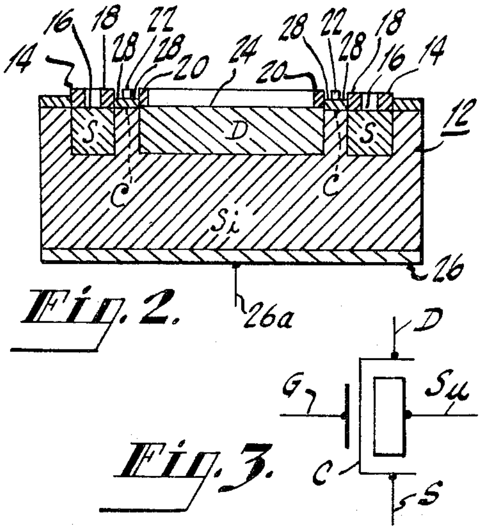
FIGURE 2 is a cross section view taken along section line 2—2 of FIGURE 1.
FIGURE 3 is a symbol representation of an insulated-gate field-effect transistor.

The body 12 is then heated in a suitable atmosphere, such as in water vapor, so that exposed silicon areas are oxidized to form grown silicon dioxide layers indicated by the lightly stippled areas of FIGURE 1. During the heating process, impurities from the deposited silicon dioxide layer diffuse into the silicon body 12 to form the source and drain regions. FIGURE 2, which is a cross section view taken along section 2—2 of FIGURE 1, shows the source-drain regions labelled S and D respectively.

By means of another photo-resist and acid etching or like step, the deposited silicon dioxide over part of the source-drain diffused regions is removed. Electrodes are formed for the source, drain and gate regions by evaporation of a conductive material by means of an evaporation mask. The conductive material evaporated may be chromium and gold in the order named, for example, but other suitable metals may be used.

The finished wafer is shown in FIGURE 1, in which the lightly stippled area between the outside boundary and the first darker zone 14 is grown silicon dioxide. The white area 16 is the metal electrode corresponding to the source electrode. Dark or more heavily stippled zones 14 and 18 are deposited silicon dioxide zones overlying the diffused source region, and the dark zone 20 is a deposited silicon dioxide zone overlying the diffused drain region. White areas 22 and 24 are the metallic electrodes which correspond to the gate and drain electrodes respectively. The stippled zone 28 is a layer of grown silicon dioxide on a portion of which the gate electrode 22 is placed and which insulates the gate electrode 22 from the substrate silicon body 12 and from the source and drain electrodes as shown in FIGURE 2. The silicon wafer is mounted on a conductive base or header 26 as shown in FIGURE 2. Connections to the substrate silicon body are made through the conductor **26*a* attached to the header 26. The input resistance of the device at low frequencies is of the order of $10^{14}$ ohms. The layer of grown silicon dioxide 28 on which the gate electrode 22 is mounted, overlies an inversion layer or conductive channel C connecting the source and drain regions. The gate electrode 22 is displaced symmetrically between the source region S and the drain region D. If desired, the gate electrode 22 may be displaced towards the source region and may overlap the deposited silicon dioxide layer 18**.

Reference is now made to FIGURE 2 of the drawings. The boundaries separating the source and drain regions S and D and the body of silicon substrate 12 effectively operate as a pair of rectifying junctions coupling the silicon substrate 12 to the source and drain electrodes 16 and 24, in such a manner that a positive bias voltage applied to the substrate with respect to the drain and source electrodes 16 and 24 renders the rectifying junction conductive, i.e., forward biased.

FIGURE 3 is a symbolic representation of the insulated-gate field-effect transistor previously described in FIGURES 1 and 2. There is shown the gate electrode G, the drain electrode D, the source electrode S, and the substrate of semiconductor material $S_u$. It should be noted that electrodes D and S operate as the drain and source electrodes as a function of the polarity of the bias potential applied therebetween; i.e., the electrode to which a positive bias potential is applied (relative to the bias potential applied to the other electrode) operates as a drain electrode, and the other elecerode operates as a source electrode.

The drain and source electrodes are connected to each other by a coductive channel C. The majority current carriers (in this case electrons) flow from source to drain in this thin channel region close to the surface. The conductive channel C is shown in FIGURE 2 in dotted lines.

Figure 4:
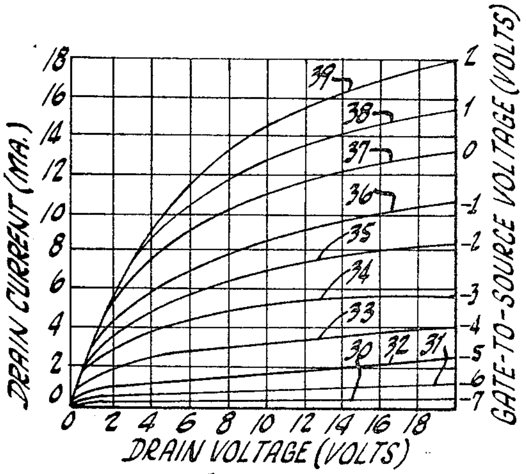
FIGURE 4 is a graph showing a family of drain current versus source-to-drain voltage curves for various values of gate-to-source voltages for the transistor of FIGURE 1.

FIGURE 4 is a family of curves 30–39 illustrating the drain current versus drain voltage characteristics of the transistor of FIGURE 1 for different values of gate-to-source voltage. A feature of an insulated-gate field-effect transistor is that the zero bias characteristic can be at any of the curves 30–39. In FIGURE 4 the curve 37 corresponds to the zero bias gate-to-source voltage. Curves 38 and 39 represent positive gate voltages relative to the source, and the curves 30–36 represent negative gate voltages relative to the source.

The location of the zero bias curve is selected during the manufacture of the transistor, i.e., by controlling the time or the temperature, or both, during the step of the process in which the silicon dioxide layer 28, shown in FIGURES 1 and 2, is grown. The longer the transistor is baked and the higher the temperature in a dry oxygen atmosphere the larger the drain current will be for a given amount of drain voltage at zero bias between the source and gate electrodes.

Figure 5:
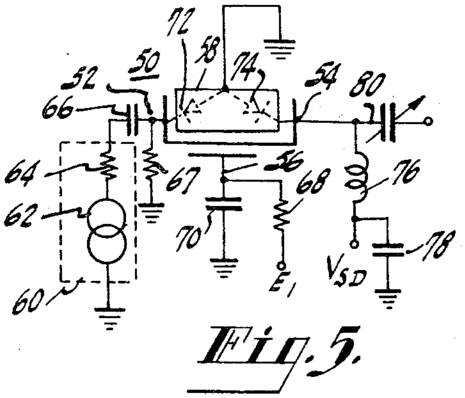
FIGURE 5 is a schematic circuit diagram of a signal translating circuit embodying the invention.

Reference is now made to FIGURE 5, which is a schematic diagram of an amplifier circuit employing an insulated-gate field-effect transistor 50 similar to the one described in FIGURES 1 and 2. The transistor 50 has an input or source electrode 52, an output or drain electrode 54, a common or gate electrode 56, and a substrate 58 of semiconductor material. The input and output electrodes 52 and 54 operate as the source and drain electrodes in accordance with the polarity of the potential applied in between them, that is, the electrode which has a positive potential applied thereto with respect to the potential of the other electrode, operates as the drain electrode.

A source of input signals 60, which comprises a generator signal source 62 and the internal resistance of the generator represented by the resistor 64, is coupled between the input electrode 52 and a point of reference potential, shown as ground, through a coupling capacitor 66. A resistor 67 references to input electrode 52 to ground. The common electrode 56 is connected through a resistor 68 to a source of bias potential $E_1$, not shown, which sets the operating point of the transistor. The common electrode 56 is maintained at reference or ground potential for signal frequencies by a capacitor 70. Coupling the common electrode 56 to ground reduces the signal feedback through the intrinsic capacitance of the field-effect transistor 50 between the output electrode and the input electrode.

A pair of rectifying junctions 72 and 74 exist between the substrate 58 of semiconductor material and the input and output electrodes 52 and 54 respectively. The pair of rectifying junctions 72 and 74 are poled in such a manner that a positive voltage applied to the substrate with respect to the potential applied to the input or output electrodes 52 or 54 render the rectifying junctions 72 and 74 conductive. The rectifying junctions 72 and 74 have intrinsic capacitance, which in this particular case provides a feedback path between the input and output circuits.

The substrate 58 of semiconductor material is directly connected to ground. Energy transfer between the input and output circuits by way of the substrate is thereby reduced, and the intrinsic capacitive voltage divider circuit (between the input and output electrodes) is transformed into a pair of capacitors respectively connected between the input and output electrodes and ground.

An energizing voltage $V_{sd}$ is coupled between the input and output selectrodes through an inductor 76 from a source of bias potential, not shown, which may be a battery, for example. A bypass capacitor 78 is connected between the low signal potential terminal of the inductor 76 and ground. Output signals are derived from the output electrode 54 and are coupled through a variable capacitor 80 to a utilization circuit, not shown.

In operation, a portion of the output signal derived from the output electrode 54 would ordinarily be fed back through the capacitive voltage divider network comprising the intrinsic capacitance of the rectifying junctions 72 and 74 if the substrate of semiconductor material 58 were not grounded. Grounding the substrate of semiconductor material 58, however, reduces energy transfer from the output to the input circuit, and therefore provides stabilization of the circuit. Grounding the substrate also back biases the rectifying junctions 72 and 74 which results in a corresponding decrease of intrinsic capacitance of the rectifying junctions. In addition it divides the intrinsic capacitance by providing two separate paths to ground.

It should be understood that although the substrate 58 is shown directly connected to ground, the important consideration to reduce energy feedback from the output to the input electrodes of the field-effect transistor 50 is that the substrate 58 is direct current reverse biased with respect to the bias potential of both input and output electrodes 52 and 54, and that the substrate 58 is alternating current referenced. For example, the substrate 58 may be (1) connected to a voltage divider network comprising two resistors connected between the source of operating potential $V_{sd}$ and ground, and (2) A.-C. coupled to ground through a capacitor exhibiting a low impedance at signal frequency and which is connected in parallel with one of the resistors of the voltage divider network to ground.

If the substrate 58 were left unconnected, signal distortion would occur. The rectifying junction 72, for example, would be rendered conductive, for a sufficiently large negative-signal-swing, causing signal clipping. Signal clipping is avoided by connecting the substrate 58 to a point of reference potential as previously described.

Figure 6:
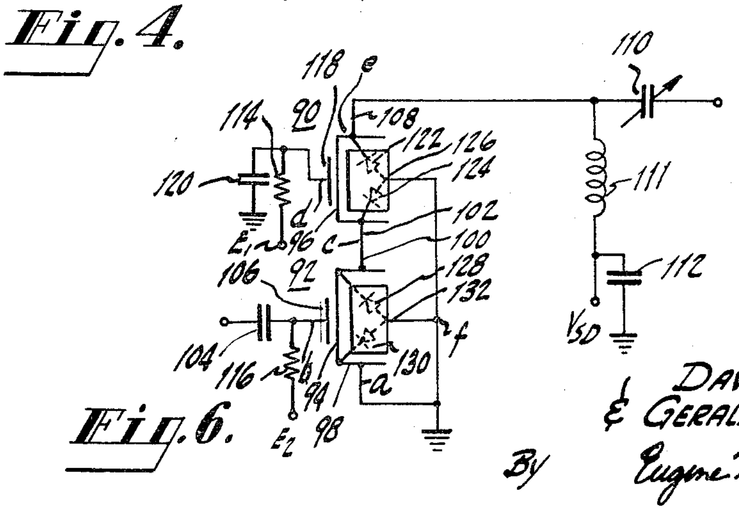
FIGURE 6 is a schematic circuit diagram of a cascode amplifier circuit embodying the invention.

Reference is now made to FIGURE 6 of the drawings, which is a schematic circuit diagram of an amplifier circuit employing insulated-gate field-effect transistors 90 and 92 that are similar to the field-effect transistor described in FIGURES 1 and 2 of the drawings. The field-effect transistors 90 and 92 have their source-to-drain current paths 94 and 96 connected in series by connecting the drain electrode 100 of the field-effect transistor 92 to the source electrode 102 of the field-effect transistor 90. The source electrode 98 is connected to a point of reference potential shown as ground.

Input signals are applied from a signal source, not shown, through a coupling capacitor 104 to the gate electrode 106 of the field-effect transistor 92. An output signal is derived from the drain electrode 108 of the field-effect transistor 90 and is coupled through a variable capacitor 110 into a utilization circuit not shown. A direct voltage is applied between the drain electrode 108 of the field-effect transistor 90 and the source electrode 98 of the field-effect transistor 92 through an inductor 111 from a source of operating potential $V_{sd}$, not shown, which may be a battery for example. A capacitor 112 bypasses the operating potential $V_{sd}$ for signal frequencies. The gate electrodes 118 and 106 of the field-effect transistors 90 and 92 are respectively biased with respect to the source electrodes 102 and 98 from sources of bias potential $E_1$ and $E_2$ through resistors 114 and 116. The gate electrode 118 of the field-effect transistor 90 is coupled to ground for signal frequencies by means of a capacitor 120.

A pair of rectifying junctions 122 and 124 exist between the substrate 126 of semiconductor material of the field-effect transistor 90 and the drain and source electrodes 108 and 102 respectively. Similarly, a pair of rectifying junctions 128 and 130 exist between the substrate 132 of semiconductor material and the drain and source electrodes 100 and 98 of the field-effect transistor 92. The rectifying junctions 122, 126, 128 and 130 are poled so that their anodes are at the substrates 126 and 132 respectively.

By connecting the substrates of semiconductor material 126 and 132 to ground, isolation between the input and output electrodes, and thereby stabilization of the amplifier circuit is provided. The input stage of the amplifier circuit (which includes the field-effect transistor 92 as the active element) is stabilized by the loading caused by the low imput impedance of the output stage (which includes the field-effect transistor 90 as the active element). The reason why the input impedance of the common-gate stage is low is that the input impedance includes the resistance exhibited by the source-drain current path which is in the order of hundreds of ohms, in comparison to the high input impedance ($10^{14}$ ohms) of the common-source configuration.

The output stage of the amplifier circuit is stabilized by means of the capacitor 120 which provides an alternating current ground for the gate electrode 118, to isolate the output and input electrodes 108 and 102, and thereby reduce energy transfer through the intrinsic capacitance between the gate electrode and the output and input electrodes respectively. However, the intrinsic capacitance of the rectifying junctions 122 and 124, provides another feedback path which creates instability problems. Energy feedback through the rectifying junctions is reduced by grounding the substrate 126 of semiconductor material to effectively provide a shield between the output and input electrodes 108 and 102. Grounding the substrates 126 and 132 also reduces the capacitance of the rectifying junctions 122, 124, 128 and 130 because the rectifying junctions are thereby back-biased.

If the substrates 126 and 132 were left unconnected, distortion of the output signal would occur. For example, when the signal appearing at the source electrode 102 swings negatively with respect to the voltage at the substrate 126, the rectifying junction 124 would be rendered conductive causing rectification of the signal. Similarly, rectifying junction 128 may cause rectification or clipping of the signals. This is because the substrate 132 tends to assume the average positive potential of the drain electrode 100 through the back resistance of the rectifying junction 128. Thus, if the drain 100 swings sufficiently in the negative direction, the rectifying junction 128 conducts causing signal clipping. By grounding both substrates 126 and 132 the rectifying junctions are maintained in a back biased condition so that distortion of the output signal is avoided. If desired, the circuit of FIGURE 6 may be altered to zero-bias operation of the field-effect transistor 90 by connecting the resistor 114 between the gate and source electrodes 118 and 108.

The gate electrode 106 may be positively or negatively biased with respect to the source electrode 98 depending on the characteristics of the field-effect transistor 92.

Figures 7, 8, 9:
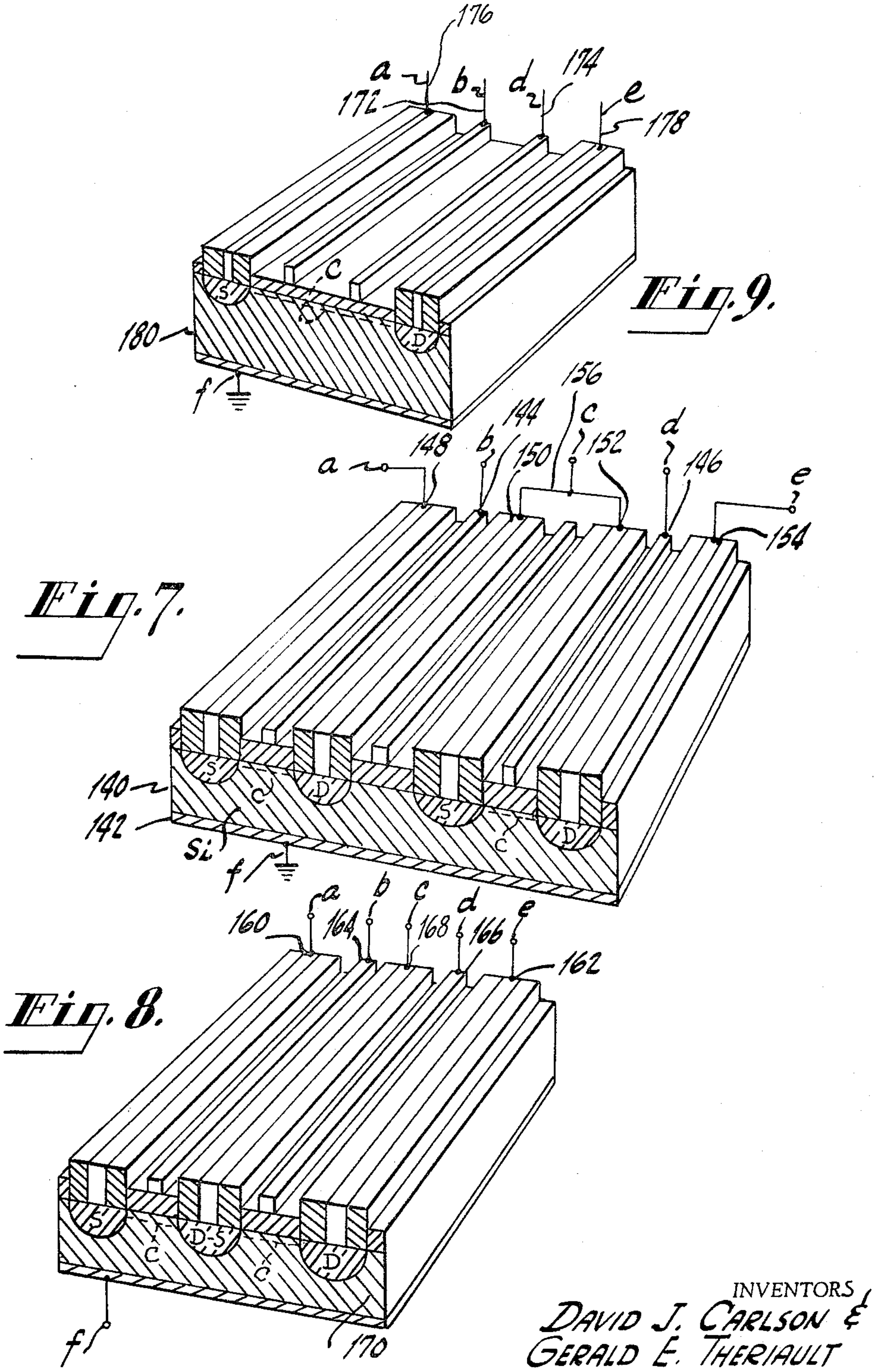
FIGURE 7 is a perspective view, partially in cross section, of a pair of insulated-gate field-effect transistors having a common substrate which may be used in circuits embodying the invention.
FIGURE 8 is a perspective view, partially in cross section, of still another insulated-gate field-effect transistor which may also be used in circuits embodying the invention.
FIGURE 9 is a perspective view, partially in cross section, of an insulated-gate field-effect transistor having two gate electrodes and a single conductive channel.

Reference is now made to FIGURE 7 of the drawings, which is a perspective view, partially in cross section, of an integrated semiconductor device which includes two field-effect transistors having a common substrate. The integrated device comprises a body 140 of semiconductor material on which two gate electrodes 144 and 146 are formed. The gate electrodes 144 and 146 are insulated from the substrate by layers of grown silicon dioxide which overlie an inversion layer or conductive channel C connecting the source and drain regions S and D which are formed by diffusion of doped silicon dioxide as explained in connection with FIGURES 1 and 2. Deposited silicon dioxide overlies a portion of the diffused source and drain regions S and D, as also previously explained. The conductive electrodes 148 and 152 are the source electrodes, and the conductive electrodes 150 and 154 are the drain electrodes. A conductor 156 connects the drain electrode 150 to the source electrode 152, placing the source-to-drain current paths of the two field-effect transistors in series.

The device shown in FIGURE 7 may be encapsulated or packaged as a six terminal field-effect transistor suitable for use as the single active element of a cascode amplifier circuit similar to the one shown in FIGURE 6. The substrate of semiconductor material 140 is mounted on a conductive base or header 142. The base 142 may be connected to a point of fixed bias potential to maintain the substrate reverse direct current biased with respect to the operating potential of the source and drain electrodes. This connection provides the desired isolation between the output and input circuits of the amplifier and an alternating current signal reference to provide operation without signal distortion.

To operate the integrated device shown in FIGURE 7 in a cascode amplifier circuit, input signals are applied between the gate electrode 144 and the source electrode 148, which is grounded. Output signals are derived from the drain electrode 154. The gate electrode 146 is coupled to ground through a capacitor to provide for isolation between the drain and source electrodes 154 and 152 as previously explained. The header 142 is grounded, as shown in FIGURE 7, in order to D.-C. reverse bias the substrate 140 with respect to the potential of the drain electrodes 150 and 154 and the source electrode 152. An operating voltage is applied between the drain electrode 154 and the source electrode 148, and biasing circuit means are coupled to the gate electrodes 144 and 146 to determine the operating point of the integrated device. The reference characters *a, b, c, d, e* and *f* of FIGURES 6 and 7, indicate the electrodes of the devices shown in FIGURE 7 which correspond to the electrodes of transistors 50 and 52 shown in FIGURE 6.

Other versions of a field-effect transistor which may be used in practicing the invention are shown in FIGURES 8 and 9 of the drawings. FIGURE 8, for example, shows an insulated-gate field-effect transistor having a source electrode 160, a drain electrode 162, gate electrodes 164 and 166 and an intermediate electrode 168 which operates as a drain electrode with respect to the source electrode 160, and as a source electrode with respect to the drain electrode 162. The device shown in FIGURE 8 may be encapsulated to provide connections to the various electrodes including the common substrate 170 so that the device may be connected for operation as a cascode amplifier.

The source electrode 160 and the drain electrode 162 correspond respectively to the source electrode 148 and the drain electrode 154 of the device shown in FIGURE 7. Input signals are applied to the gate electrode 164. The electrode 168 is shown having a terminal so that the gate electrode 166 may be D.-C. referenced to the electrode 168 for zero-bias-voltage operation of the output stage. The electrodes of the device shown in FIGURE 8 have been identified by the source reference characters *a, b, c, d, e* and *f*, to show how the device of FIGURE 8 may be connected in a cascode amplifier circuit similar to the one shown in FIGURE 6.

FIGURE 9 of the drawings shows an insulated-gate field-effect transistor having two gate electrodes 172 and 174 controlling a single conductive channel C, which channel connects the source and drain regions S and D. A source electrode 178 and a drain electrode 178 respectively correspond to the source and drain regions S and D.

The device shown in FIGURE 9 has a single substrate 180, so that a single ground connection is used for a cascode-amplifier operation. Input signal energy may be applied to the gate electrode 172. The gate electrode 174 is biased to a potential intermediate that of the source and drain electrodes 176 and 178. When connected for operation in a cascode amplifier the device of FIGURE 9 may be considered as having a virtual intermediate electrode corresponding to the drain electrode of the input transistor portion and the source of the output transistor portions. Accordingly, the D.-C. bias at the gate electrode 174 may be considered as being referred to the virtual electrode.

The device shown in FIGURE 9 may also be connected in a cascode amplifier circuit similar to the one shown in FIGURE 6. The source, gate and drain electrodes of the device shown in FIGURE 9 are also identified by the reference characters *a, b, d, e* and *f* to illustrate how the device is connected in a cascode amplifier circuit similar to the one shown in FIGURE 6.

It should be noted that FIGURES 7, 8 and 9 are perspective views, partially in cross section, of insulated-gate field-effect transistors which are not of a circular or concentric configuration as the configuration of the transistor shown in FIGURE 1 of the drawings. The source, gate and drain eelctrodes extend at an angle from the plane of the drawing, as shown. As previously explained, FIGURE 2 shows a transistor having a single drain electrode 24, a single gate electrode 22 and a single source electrode 16. In comparison the transistor shown in FIGURE 7 has two drain electrodes 150 and 154, two source electrodes 148 and 152, and two gate electrodes 144 and 146. Similarly, the field-effect transistors shown in FIGURES 8 and 9, are of a planar rather than circular configuration.

What is claimed is:

1. A high frequency signal translating circuit comprising:

a field effect transistor having a source electrode, a drain electrode, and a gate electrode formed on a substrate of semiconductor material, with said gate electrode being insulated from said substrate;

electrical circuit means coupled to said source, drain, and gate electrodes for connecting said transistor in a common gate amplifier configuration; and means coupled to the substrate of said transistor for reverse biasing said substrate relative to said source and drain electrodes and for maintaining said substrate at a fixed reference potential for signal frequencies, to reduce undesired signal feedback within said field effect transistor.

2. A high frequency signal translating circuit according to claim 1 in which there is also included means coupled to said gate electrode for maintaining said electrode at a fixed reference potential for signal frequencies, to further reduce undesired signal feedback within said field effect transistor.

3. A high frequency signal translating circuit comprising:

a field effect transistor having a source electrode, a drain electrode, and a gate electrode formed on a substrate of semiconductor material, with said gate electrode being insulated from said substrate, said field effect transistor including a pair of rectifying junctions coupled (a) between said substrate and said source electrode and (b) between said substrate and said drain electrode, each of said pair having intrinsic capacitance associated therewith providing a conductive path for undesired signal feedback within said transistor;

electrical circuit means coupled to said source, drain, and gate electrodes for connecting said transistor in a common gate amplifier configuration; and means coupled to the substrate of said transistor for reducing the capacitance of said rectifying junctions and, therefore, the conductivity of said feedback path and for maintaining said substrate at a fixed reference potential for signal frequencies, to reduce undesired signal feedback within said field effect transistor.

4. A high frequency signal translating circuit comprising:

a field effect transistor having a source electrode, a drain electrode, and a gate electrode formed on a substrate of semiconductor material, with said gate electrode being insulated from said substrate;

electrical circiut means coupled to said source, drain, and gate electrodes for connecting said transistor in a common gate amplifier configuration, with said source electrode forming part of a signal input circuit and said drain electrode forming part of a signal output circuit; and means coupled to the substrate of said transistor for reverse biasing said substrate relative to said source and drain electrodes and for isolating said output circuit from said input circuit at signal frequencies, to reduce undesired signal feedback within said field effect transistor.

5. A high frequency signal amplifier comprising:

a field effect transistor having a source electrode, a drain electrode, and a gate electrode formed on a substrate of semiconductor material, with said gate electrode being insulated from said substrate;

means coupled between said source electrode and a point of reference potential for providing a signal input circiut for said amplifier;

means coupled between said drain electrode and said point of reference potential for providing a signal output circuit for said amplifier;

means coupled between said gate electrode and said point of reference potential for providing at signal frequencies, a low impedance path to said point of potential for energy feedback from said output circuit to said input circuit; and means coupled to the substrate of said transistor for reverse biasing said substrate relative to said source and drain electrodes and for maintaining said substrate at said reference potential for signal frequencies, to improve stability of amplifier operation.

6. A high frequency signal amplifier comprising:

a field effect transistor having a source electrode, a drain electrode, and a gate electrode formed on a substrate of semiconductor material, with said gate electrode being insulated from said substrate;

means coupled between said source electrode and a point of reference potential for providing a signal input circuit for said amplifier;

means coupled between said drain electrode and said point of reference potential for providing a signal output circuit for said amplifier;

means coupled between said gate electrode and said point of reference potential for providing at signal frequencies, a low impedance path to said point of potential for energy feedback from said output circuit to said input circuit; and means coupled to the substrate of said transistor for connecting said substrate to said point of reference potential, to improve stability of amplifier operation.

7. A high frequency signal amplifier comprising:

a field effect transistor having a source electrode, a drain electrode, a common source-drain electrode, and two gate electrodes formed on a substrate of semiconductor material, with said gate electrodes being insulated from said substrate;

means coupled between one of said gate electrodes and said source electrode for providing a signal input circuit for said amplifier;

means coupled between said drain electrode and said source electrode for providing a signal output circuit for said amplifier;

means coupled between the other of said gate electrodes and a point of reference potential for providing at signal frequencies a low impedance path to said point of potential for energy feedback from said drain electrode to said common source-drain electrode; and means coupled to the substrate of said transistor for reverse biasing said substrate relative to said source, drain, and source-drain electrodes and for maintaining said substrate at a fixed reference potential for signal frequencies, to reduce undesired signal feedback within said field effect transistors.

8. An amplifier circuit comprising, first and second field-effect transistors each having a source electrode, a drain electrode, and a gate electrode formed on a single substrate of semiconductor material and a source-to-drain current path, with each of said gate electrodes being insulated from said substrate, said source and drain electrodes of said first and second field-effect transistors each being effectively coupled to said substrate by a rectifying junction poled so that a positive potential applied to said substrate with respect to the potential of the corresponding one of said source and drain electrodes renders said rectifying junction conductive, means for connecting the source-to-drain current paths of said first and second field-effect transistors in series, means for applying a bias potential across the series combination of said source-to-drain current paths of said first and second field-effect transistors, circuit means for biasing said gate electrodes to predetermined bias potentials, capacitive means for coupling the gate electrode of said first field-effect transistor to the source electrode of said second field-effect transistor to provide an alternating current point of reference potential to said gate electrode of said first field-effect transistor, input circuit means coupled between the gate and source electrodes of said second field-effect transistor for applying input signals to said amplifier circuit, output circuit means coupled to the drain electrode of said first field-effect transistor for deriving output signals, and means for coupling said substrate of semiconductor material to said source electrode of said second field-effect transistor to prevent energy from feeding back from said output circuit to said input circuit.

9. In combination, a field-effect transistor having first, second and third electrodes and two gate electrodes formed on a substrate of semiconductor material, with said two gate electrodes being insulated from said substrate, said first, second and third electrodes being effectively coupled to said substrate by a rectifying junction poled so that a positive potential applied to said substrate with respect to the potential of the corresponding one of said first, second and third electrodes renders said rectifying junctions conductive, said second electrode effectively operating as a source and drain electrode with respect to said first and third electrodes respectively, circuit means for forward biasing one of said gate electrodes with respect to said second electrode, circuit means for forward biasing said other gate electrode with respect to said third electrode, a capacitor coupling said one gate electrode to a point of reference potential, means coupled between the other of said gate electrodes and said point of reference potential for applying an input signal, circuit means coupled between said first electrode and said point of reference potential for deriving an output signal, and means for coupling said third electrode and said substrate of semiconductor material to said point of reference potential to prevent energy from being fed back from said first electrode to said second electrode.

10. A signal translating circuit comprising, first and second field-effect transistors each having source and drain electrodes formed on a substrate of semiconductor material, and a gate electrode insulated from said substrate, means for connecting the source-to-drain current paths of said first and second field-effect transistors in series, circuit means providing a signal input circuit coupled between the gate and source electrodes of said first field-effect transistor, circuit means providing an output circuit coupled between said drain electrode of said second field-effect transistor and said source electrode of said first field-effect transistor, circuit means providing a low impedance at signal frequencies coupling said gate electrode of said second field-effect transistor and said source electrode of said first field-effect transistor, and means providing a low impedance at said signal frequencies coupling said substrate of said first and second field-effect transistors to said source of said first field-effect transistor to prevent energy from feeding back from said signal output circuit to said signal input circuit.

11. In combination, a field-effect transistor having a plurality of electrodes formed on a substrate of semiconductor material, at least one of which constitutes a gate electrode insulated from said substrate and the remainder of said electrodes each being effectively coupled to said substrate by a separate rectifying junction having intrinsic capacitance, means for connecting said field-effect transistor as an active element of a signal translating circuit, means providing a point of reference potential for said signal translating circuit, means for applying input signals between said point of reference potential and a selected one of said substrate coupled electrodes, means for deriving output signals from another of said substrate-coupled electrodes, and means coupling said substrate to said point of reference potential to reduce the energy transfer through said intrinsic capacitance of said rectifying junctions.

12. A signal translating circuit comprising, a field-effect semiconductor device having a source electrode, a drain electrode and two gate electrodes insulated from said substrate, means for applying an operating potential between said source and drain electrodes, circuit means for biasing said gate electrodes to predetermined bias potentials, capacitive means for coupling one of said gate electrodes to said source electrode to prevent energy feedback from said drain electrode to said one gate electrode, means coupled between the other of said gate electrodes and said source electrode for applying input signals, circuit means coupled between said drain and source electrodes for deriving output signals, and means for coupling said substrate of semiconductor material to said source electrode to prevent energy from feeding back from said output circuit to said input circuit.

References Cited by the Examiner

UNITED STATES PATENTS

| | | | |
|---|---|---|---|
| 2,586,080 | 2/1952 | Pfann. | |
| 3,010,033 | 11/1961 | Noyce. | |
| 3,056,888 | 10/1962 | Attalla. | |
| 3,135,926 | 6/1964 | Bockemuehl. | |
| 3,204,160 | 8/1965 | Sah | 317—235 |

OTHER REFERENCES

Szekely: "Integrated Linear Audio Frequency Amplifier," RCA Technical Notes, No. 454, September 1961.

ROY LAKE, *Primary Examiner.*

R. P. KANANEN, *Assistant Examiner.*